(12) United States Patent
Yamamoto

(10) Patent No.: US 11,199,770 B2
(45) Date of Patent: Dec. 14, 2021

(54) IMPRINT APPARATUS AND METHOD OF MANUFACTURING AN ARTICLE

(71) Applicant: CANON KABUSHIKI KAISHA, Tokyo (JP)

(72) Inventor: Kiyohito Yamamoto, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 261 days.

(21) Appl. No.: 16/261,427

(22) Filed: Jan. 29, 2019

(65) Prior Publication Data

US 2019/0155149 A1 May 23, 2019

Related U.S. Application Data

(63) Continuation of application No. PCT/JP2017/027354, filed on Jul. 28, 2017.

(30) Foreign Application Priority Data

Aug. 4, 2016 (JP) .............................. JP2016-154020

(51) Int. Cl.
  *B29C 59/02* (2006.01)
  *G03F 7/00* (2006.01)
  *B29C 59/00* (2006.01)

(52) U.S. Cl.
  CPC .......... *G03F 7/0002* (2013.01); *B29C 59/002* (2013.01); *B29C 59/02* (2013.01)

(58) Field of Classification Search
  CPC ..... B29C 59/02; B29C 59/002; G03F 7/0002; G03F 7/70975; H01L 21/027; H01L 21/67739; H01L 21/67772
  See application file for complete search history.

(56) References Cited

U.S. PATENT DOCUMENTS

| | | | |
|---|---|---|---|
| 2010/0031833 A1* | 2/2010 | Kasumi ................. | B82Y 10/00 101/4 |
| 2011/0272382 A1* | 11/2011 | Owa ..................... | G03F 7/0002 216/37 |
| 2014/0210134 A1* | 7/2014 | Wakamatsu .......... | B82Y 10/00 264/293 |

(Continued)

FOREIGN PATENT DOCUMENTS

| | | | | |
|---|---|---|---|---|
| EP | 0431924 B1 * | 1/1996 | ............ | B29C 67/02 |
| JP | 7-211761 A | 8/1995 | | |
| JP | 8-291384 A | 11/1996 | | |

(Continued)

*Primary Examiner* — Nahida Sultana
*Assistant Examiner* — Margaret B Hayes
(74) *Attorney, Agent, or Firm* — Canon U.S.A., Inc. IP Division

(57) ABSTRACT

An imprint apparatus includes a processing unit that forms a pattern of an imprint material on a substrate by using a mold, a chamber that accommodates this processing unit and includes a first gate to which a first containment unit that contains the substrate before being processed by the processing unit is connected and a second gate to which a second containment unit that contains the substrate after being processed by the processing unit is connected, and a control unit that prohibits opening of the first gate until a predetermined time elapses since the substrate on which the pattern is formed by the processing unit is contained in the second containment unit and the second gate is closed.

8 Claims, 7 Drawing Sheets

(56) References Cited

U.S. PATENT DOCUMENTS

2015/0224703 A1\* 8/2015 Oda .................. B29C 59/026
264/447
2016/0214312 A1\* 7/2016 Hirano ................ G03F 7/0002

FOREIGN PATENT DOCUMENTS

| JP | 8-340037 A | 12/1996 |
| JP | 2007-181938 A | 7/2007 |
| JP | 2013-145879 A | 7/2013 |
| JP | 2015-23151 A | 2/2015 |
| WO | 02/021583 A1 | 3/2002 |

\* cited by examiner

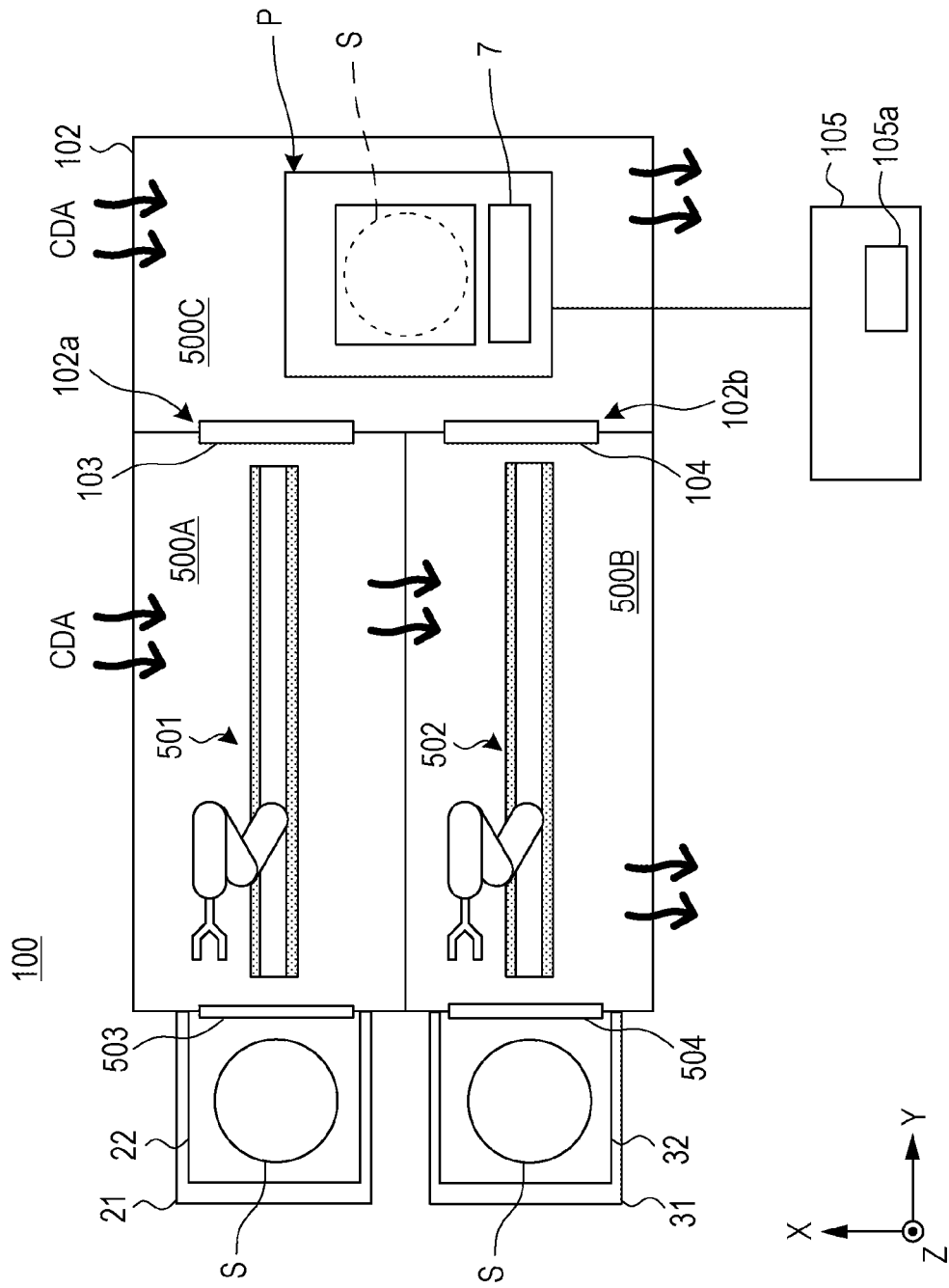

IMPRINT APPARATUS AND METHOD OF MANUFACTURING AN ARTICLE

CROSS-REFERENCE TO RELATED APPLICATIONS

This application is a Continuation of International Patent Application No. PCT/JP2017/027354, filed Jul. 28, 2017, which claims the benefit of Japanese Patent Application No. 2016-154020, filed Aug. 4, 2016, both of which are hereby incorporated by reference herein in their entirety.

TECHNICAL FIELD

The present invention relates to an imprint apparatus and a method of manufacturing an article.

BACKGROUND ART

An imprint apparatus that forms a pattern by bringing a mold (molding) into contact with an imprint material on a substrate is being put into practical use as one of lithography technologies for manufacturing an article such as a semiconductor device.

Since a highly-volatile material is often used as the imprint material, up to now, countermeasures such as a control on a supply amount of the imprint material by taking volatilization of the imprint material into account have been taken (for example, PTL 1).

CITATION LIST

Patent Literature

PTL 1: Japanese Patent Laid-Open No. 2013-145879

On the other hand, an issue exists that, since the imprint material vaporizes, volatile components diffuse to a surrounding environment to be adhered onto another substrate, and a surface state thereof changes in quality, so that stable pattern formation may be disturbed.

The present invention is aimed at providing an imprint apparatus that is advantageous to suppression of a chemical contamination within the apparatus.

SUMMARY OF INVENTION

According to an aspect of the present invention, there is provided an imprint apparatus characterized by including a processing unit that forms a pattern of an imprint material on a substrate by using a mold, a chamber that accommodates the processing unit and includes a first gate to which a first containment unit that contains the substrate before being processed by the processing unit is connected and a second gate to which a second containment unit that contains the substrate after being processed by the processing unit is connected, and a control unit that prohibits opening of the first gate until a predetermined time elapses since the substrate on which the pattern is formed by the processing unit is contained in the second containment unit and the second gate is closed.

Further features of the present invention will become apparent from the following description of exemplary embodiments with reference to the attached drawings.

BRIEF DESCRIPTION OF DRAWINGS

FIG. 5 illustrates a configuration of an imprint apparatus according to a modified example.

DESCRIPTION OF EMBODIMENTS

Hereinafter, embodiments of the present invention will be described in detail with reference to the drawings. It should be noted that the present invention is not limited to the following embodiments, and the following embodiments are merely specific examples for carrying out the present invention. In addition, all of combinations of features described in the following embodiments are not necessarily indispensable for solving the issue of the present invention.

First Embodiment

Hereinafter, an imprint apparatus according to the present embodiment will be described. The imprint apparatus is an apparatus that brings an imprint material arranged on a substrate into contact with a mold and supplies curing energy to the imprint material to form a pattern of a cured material onto which concave and convex patterns of the mold are transferred. The imprint material may be a curable composition (which may also be referred to as resin in an uncured state) which is to be cured when the curing energy is supplied. The curing energy may be an electromagnetic wave, heat, or the like. The electromagnetic wave may be, for example, light in which its wavelength is selected from a range between 10 nm or higher and 1 mm or lower (such as infrared light, visible light, or ultraviolet light).

The curable composition is a composition that is to be cured when the curing energy such as the electromagnetic wave or heat is supplied. Among those, a photo-curing composition that is cured by light contains at least a polymerizing compound and a photoinitiator and may further contain a non-polymerizing compound or solvent when necessary. The non-polymerizing compound may be at least one type selected from the group consisting of a sensitizer, a hydrogen donor, an internal additive release agent, a surfactant, an antioxidant, a polymer component, and the like.

The imprint material may be applied onto the substrate in a film shape by a spin coater or a slit coater. Alternatively, the imprint material may be supplied onto the substrate in a droplet state by a liquid jetting head or in an island state or a film state which is formed while a plurality of droplets are connected to one another. A viscosity of the imprint material (viscosity at 25° C.) may be, for example, 1 mPa·s or higher and 100 mPa·s or lower.

The substrate may be a member constituted by glass, ceramics, a metal, a semiconductor, resin, or the like. A layer made of a material different from the member may also be formed on a surface of the member when necessary. The substrate is, for example, silicon wafer, a compound semiconductor wafer, a quartz glass plate, or the like.

Figure 1:
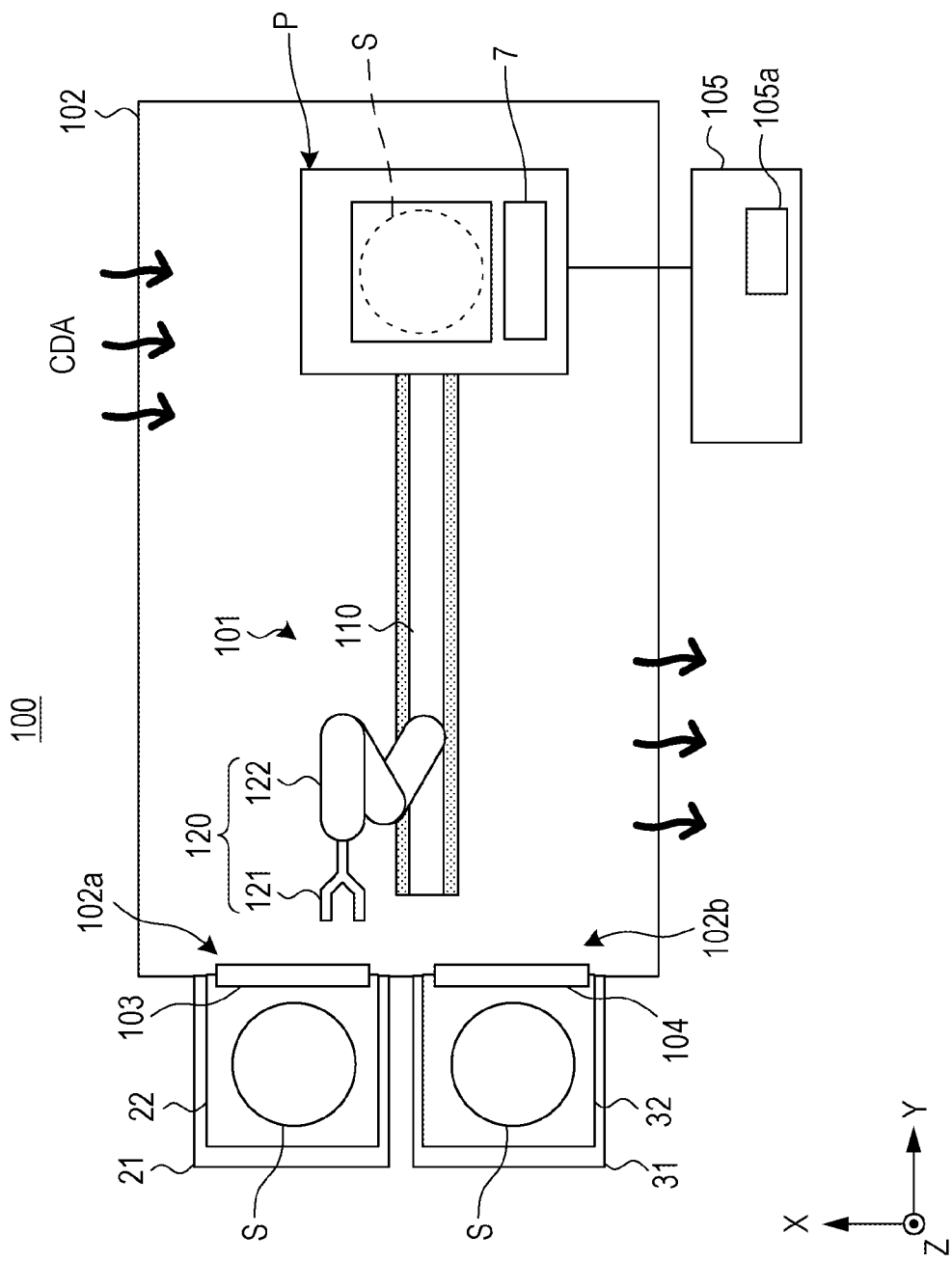
FIG. 1 illustrates a configuration of an imprint apparatus according to an embodiment.

FIG. 1 illustrates an outline configuration of an imprint apparatus 100 according to the present embodiment. The imprint apparatus 100 may include a processing unit P that performs the above-described pattern formation on the substrate and a conveyance unit 101 that performs conveyance of the substrate. The processing unit P and the conveyance unit 101 are accommodated in a chamber 102 that is provided with a dust-removing air-conditioning function. The inside of the chamber 102 is regularly supplied with clean dry air (CDA) by the air-conditioning function, and a clean state is maintained.

Figure 2:
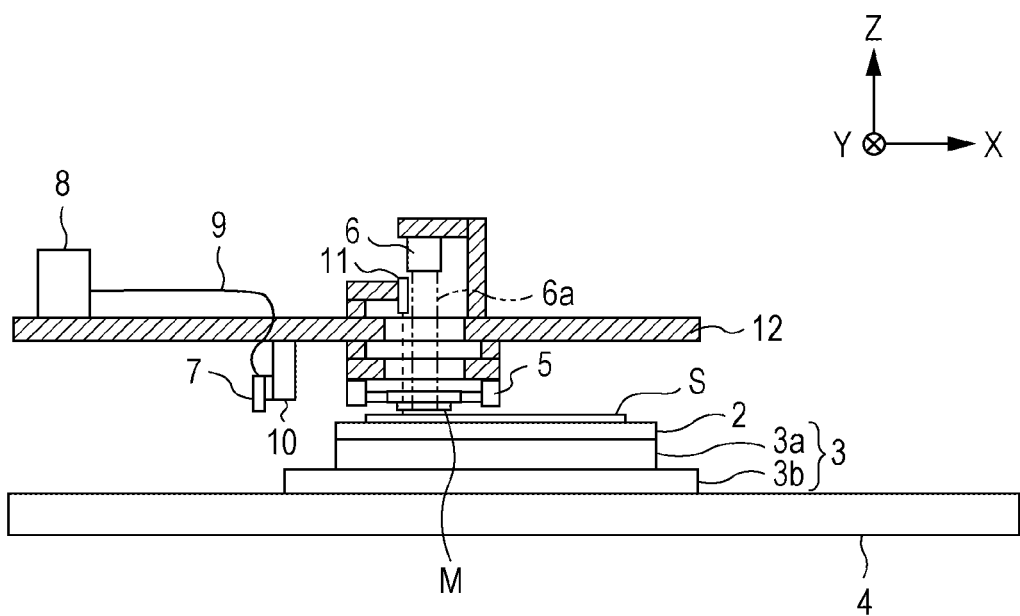
FIG. 2 illustrates a configuration of a processing unit according to the embodiment.

FIG. 2 illustrates a configuration of the processing unit P. The processing unit P is configured to perform pattern formation in a plurality of shot areas of a substrate S by repeating an imprint cycle. Herein, one imprint cycle is a cycle where the imprint material is cured in a state in which a mold M is in contact with the imprint material on the substrate S to perform pattern formation in one shot area of the substrate S. According to this, a pattern corresponding to a pattern of the mold may be formed on a surface layer of the substrate S. A substrate stage 3 moves the substrate S in an XY direction. A chuck 2 performs suction holding of the substrate S. The chuck 2 is detachably attached to the substrate stage 3 for washing, replacement, or the like. A base frame 4 supports the substrate stage 3. The substrate stage 3 may include a fine adjustment stage 3a that holds the substrate and a coarse adjustment stage 3b that supports the fine adjustment stage 3a.

A mold driving unit 5 is a driving device that performs vertical driving of the mold M and performs an operation for bringing the mold M into contact with the imprint material on the substrate S. An irradiation unit 6 radiates ultraviolet light 6a to the imprint material via the mold M to cure the imprint material. In addition, the irradiation unit 6 includes a light source such as a halogen lamp that generates the ultraviolet light 6a and a function for performing converging shaping of the light generated by the light source. A dispenser 7 (supply unit) can arrange (supply) a predetermined amount of the imprint material onto the substrate S by forming droplets of the imprint material to be ejected. The imprint material is stored in a tank 8 and supplied to the dispenser 7 via a duct 9.

A movement apparatus 10 moves the dispenser 7 between an ejection position and a retreat position (maintenance position) of the imprint material. At the time of a normal ejection operation, the dispenser is positioned at the ejection position, and when maintenance of the dispenser 7 is performed, the dispenser is moved to the retreat position (maintenance position), and cleaning and replacement of the dispenser 7 are performed.

A substrate position detection unit 11 may include a microscope for performing an alignment between the substrate S on which the imprint material is arranged by the dispenser 7 and the mold M. The substrate position detection unit 11 measures an alignment mark arranged on the mold M and an alignment mark arranged on the substrate S by the microscope to perform mutual positioning. A method based on image processing is appropriate as a measurement method, and a detection target at this time may be at least a positional shift in the XY direction and a shift in a θ direction. Furthermore, a positional shift in a vertical direction (Z direction) may be added as the detection target. A mold platen 12 performs supporting fixation of the dispenser 7 to the substrate position detection unit 11, the mold M, and the irradiation unit 6.

Descriptions will be provided with reference to FIG. 1 again. A first opening section 102a and a second opening section 102b with which the outside and the processing unit P are communicated with each other are formed in the chamber 102. In addition, a first gate 103 and a second gate 104 which are openable and closable are respectively arranged in the first opening section 102a and the second opening section 102b. Opening and closing of the first gate 103 and opening and closing of the second gate 104 may be controlled by a control unit 105. The imprint apparatus 100 can establish a connection of a first load port 21 via the first gate 103 and can establish a connection of a second load port 31 via the second gate 104. A first containment unit 22 that contains the substrate may be mounted to the first load port 21. In addition, a second containment unit 32 that contains the substrate may be mounted to the second load port 31. The first containment unit 22 and the second containment unit 32 may be an FOUP (Front-Opening Unified Pod) that contains a plurality of substrates. When the first gate 103 is opened, a state is established in which an interior space of the first containment unit 22 and an interior space of the chamber 102 of the imprint apparatus 100 are communicated with each other. In the same manner, when the second gate 104 is opened, a state is established in which an interior space of the second containment unit 32 and the interior space of the chamber 102 of the imprint apparatus 100 are communicated with each other.

The conveyance unit 101 conveys the substrate between each of the first containment unit 22 and the second containment unit 32 and the processing unit P. The conveyance unit 101 includes a conveyance path 110 serving as a rail or a travelling guide and a conveyance robot 120 that travels along the conveyance path 110. The conveyance robot 120 includes a hand 121 that grabs the substrate and an arm 122 that supports the hand 121. The arm 122 can perform expansion and contraction operations by a multi-joint structure and also can perform the operation in a z-axis direction and in a rotational direction about the z-axis.

The control unit 105 controls operations of the processing unit P, the conveyance unit 101, the first gate 103, and the second gate 104 in an overall manner. The control unit 105 may include a CPU that is not illustrated in the drawing and also includes a storage unit 105a such as a memory that stores various data necessary for the control.

It should be noted that only the conveyance unit 101 and the processing unit P are illustrated in the chamber 102 in the example of FIG. 1, but various pretreatment units may also be included. As examples of the pretreatment units may include a heat regulation unit that performs a temperature adjustment of the substrate, a prealignment unit that previously adjusts a position and a rotational angle of the substrate, and the like. In addition, a configuration may be adopted in which a plurality of processing units P are included in the chamber 102.

As described above, when the imprint material vaporizes, volatile components diffuse to a surrounding environment to be adhered onto another substrate, and a surface state thereof may change in quality in some cases (so-called cross contamination). When this cross contamination occurs, an issue occurs that the stable pattern formation may be disturbed.

In view of the above, according to the present embodiment, the first containment unit 22 is used as a containment unit that contains the previous substrate processed by the processing unit P, and the second containment unit 32 is used as a containment unit that contains the substrate already processed by the processing unit P. Therefore, the unprocessed substrate S is carried out by a conveyance robot 120 from the first containment unit 22 via the first gate 103 to be carried into the chamber 102. The substrate S carried into the chamber 102 is conveyed to the processing unit P by the conveyance robot 120, and the above-described imprint processing is executed. The already processed substrate S on which the pattern is formed by the imprint processing is carried out by the conveyance robot 120 from the chamber 102 through the second gate 104 to the second containment unit 32.

In this manner, spaces between the first containment unit 22 and the second containment unit 32 (the first load port 21 and the second load port 31) and the inside of the chamber 102 are blocked by the first gate 103 and the second gate 104 and become mutually independent spaces. When the first gate 103 and the second gate 104 are opened, the substrate conveyance can be performed between the respective spaces. The first gate 103 and the second gate 104 are closed as an initial state of the apparatus.

Figure 3:
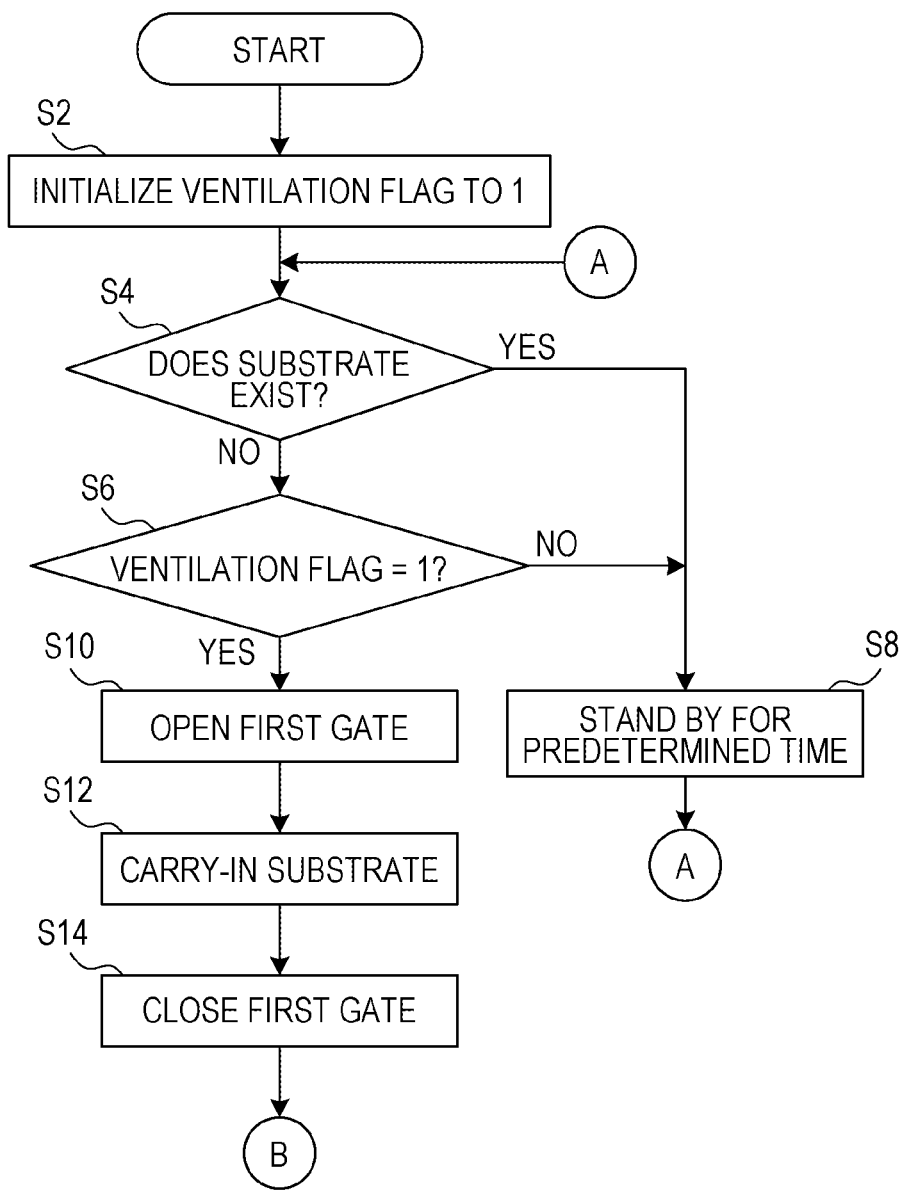
FIG. 3 is a flow chart for describing a substrate conveyance control according to the embodiment.
Figure 4:
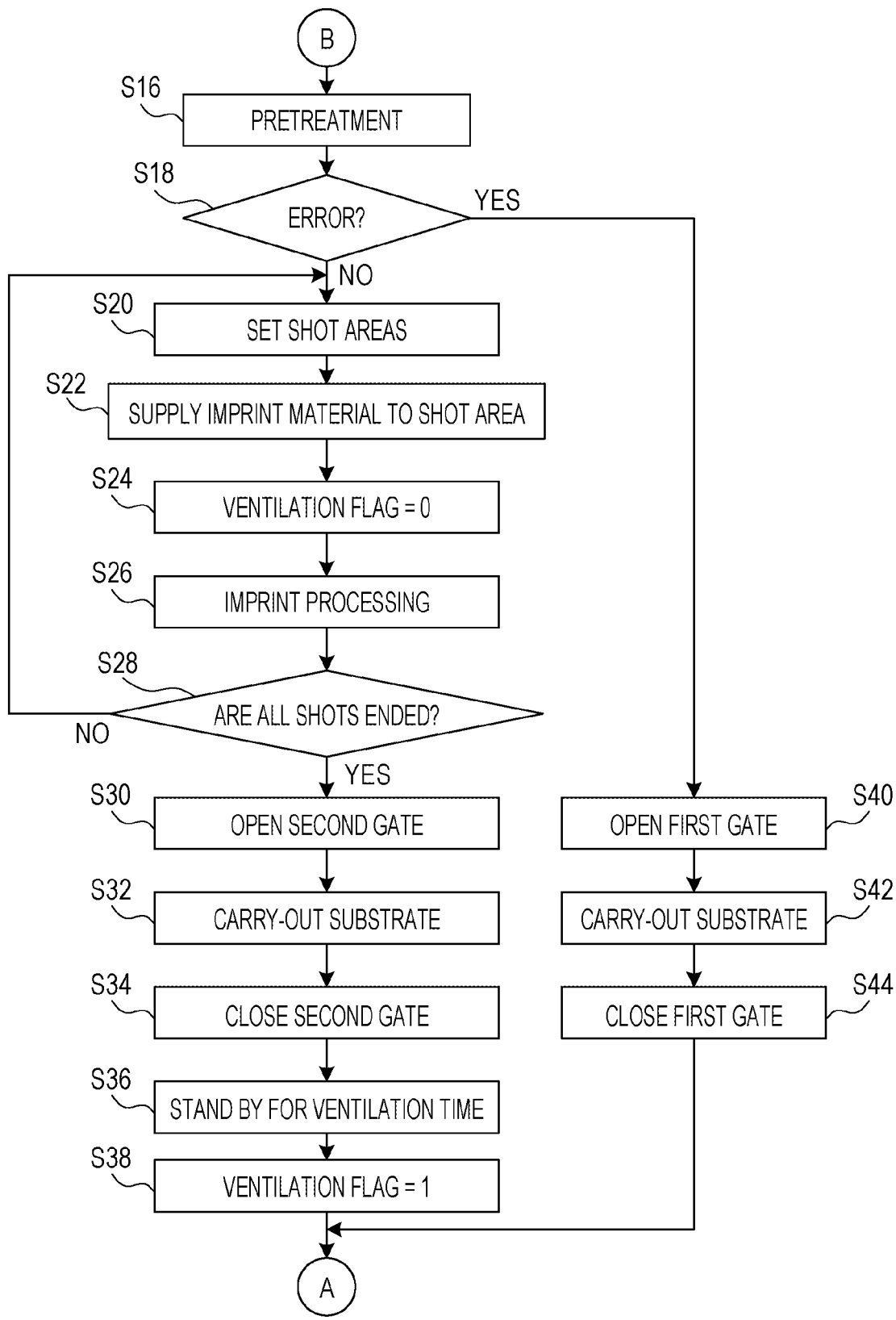
FIG. 4 is a flow chart for describing the substrate conveyance control according to the embodiment.

Hereinafter, an example of the substrate conveyance control according to the present embodiment will be described. FIG. 3 and FIG. 4 are flow charts for a conveyance control with regard to the single substrate. A program corresponding to the flow charts of FIG. 3 and FIG. 4 is stored in the storage unit 105a, for example, and may be executed by the control unit 105.

A storage area for a ventilation flag representing a ventilation state in the chamber 102 is previously secured in the storage unit 105a. The ventilation flag may take one of two values, that is, 1 or 0, where the ventilation flag=1 represents that the inside of the chamber 102 is in a clean state, and the ventilation flag=0 represents that the inside of the chamber 102 is not in the clean state. First, the control unit 105 initializes the ventilation flag to 1 (S2). Thereafter, the control unit 105 checks whether the substrate does not exist in the chamber 102 (S4). When it is checked that the substrate does not exist in the chamber 102, next, the control unit 105 checks whether the ventilation flag is set as 1 (S6). In a case where it is determined in S4 that the substrate exists in the chamber 102 or determined in S6 that the ventilation flag is not set as 1 (that is, the ventilation flag=0), the flow proceeds to S8, and after standing by for a predetermined time, the flow returns to S4 to repeat the processing.

In a case where the ventilation flag=1 is confirmed in S6, it is determined that the substrate does not exist in the chamber 102, and the inside of the chamber 102 is in the clean state. In this case, the control unit 105 performs the substrate carry-in operation in S10 to S14. That is, the control unit 105 opens the first gate 103 (S10), controls the conveyance robot 120 to convey the unprocessed substrate from the first containment unit 22 to the processing unit P via the first gate 103 (S12), and thereafter closes the first gate 103 (S14). At this time point, since the first containment unit 22 and the inside of the chamber 102 are both in the clean state, the cross contamination does not occur. After the substrate S is carried into the chamber 102 in S12, the first gate 103 is closed in S14, and therefore the first containment unit 22 and the chamber 102 are disconnected from each other.

In S16, predetermined pretreatment such as temperature adjustment of the substrate S or prealignment is performed. The control unit 105 determines on the presence or absence of a conveyance error of the substrate or an error in the pretreatment (S18). When the error does not exist, the process proceeds to S20. In S20, the control unit 105 sets shot areas in accordance with a previously set shot order. Next, the control unit 105 controls the substrate stage 3 such that the set shot area of the substrate S is located immediately below the dispenser 7, and thereafter controls the dispenser 7 to supply the imprint material to this shot area (S22). At this time, since the space in the chamber 102 is in a state in which the space may be contaminated by mist generated at the time of the supply of the imprint material or the volatilization of the imprint material, the control unit 105 sets the ventilation flag as 0 (S24). It should be noted that, since the first gate 103 and the second gate 104 are closed at this time, the space in the first containment unit 22 is not to be contaminated. Therefore, even when the substrate to be processed later exists in the first containment unit 22, the substrate does not receive the contamination based on the cross contamination.

Next, the control unit 105 executes the imprint processing (S26). Specifically, the control unit 105 controls the substrate stage 3 such that the shot area of the substrate S is positioned immediately below the mold driving unit 5, and thereafter controls the mold driving unit 5 such that the mold M is brought into contact with the imprint material on the shot area of the substrate S. According to this, after a pattern section of the mold M is filled with the imprint material, the control unit 105 controls the irradiation unit 6 to radiate the ultraviolet light 6a to the imprint material via the mold M to cure the imprint material. Thereafter, the control unit 105 controls the mold driving unit 5 to separate the mold M from the cured imprint material (mold release).

After the above-described imprint processing is completed, the control unit 105 determines whether or not the imprint processing in all the shot areas of the substrate S is ended (S28). When the imprint processing in in all the shot areas is not ended, the flow returns to S20 to repeat the processing with regard to the next shot area.

Since the already processed substrate S is exposed to a contaminated space in the step for supplying the imprint material (S22), when the already processed substrate is returned to the first containment unit 22, the space in the first containment unit 22 is contaminated, and as a result, there is a possibility that the substrate to be processed later may be contaminated. In view of the above, according to the present embodiment, when the imprint processing in all the shot areas is ended, the control unit 105 performs a substrate carry-out operation for containing the already processed substrate S in the second containment unit 32 in S30 to S34 without returning the already processed substrate to the first containment unit 22. Specifically, the control unit 105 opens the second gate 104 (S30) and controls the conveyance robot 120 to convey the already processed substrate S from the processing unit P to the second containment unit 32 via the second gate 104 (S32), and thereafter closes the second gate 104 (S34). Herein, since the second containment unit 32 is communicated with the contaminated space in the chamber 102 through the second gate 104, and the substrate S corresponding to a contamination source is carried into the second containment unit 32, the space in the second containment unit 32 may be contaminated. At this time point, it can be mentioned that the space in the chamber 102 and the space in the second containment unit 32 are in a contaminated state. When the first gate 103 is opened to process the next substrate in this state (S10), there is a fear that the contaminated gas in the chamber 102 may flow into the first containment unit 22 through the first gate 103. Moreover, since the substrate is also carried into the contaminated chamber 102, there is a risk that a cause of defect derived from the cross contamination may occur.

To avoid this risk, in S36, the control unit 105 stands by for a predetermined time in S34. The predetermined time is, for example, a time spent from when the second gate 104 is closed until the volatile components of the imprint material are exhausted to the outside of the chamber 102. The substrate S is already carried out from the chamber 102, and the second gate 104 is also closed. That is, the substrate corresponding to the contamination source does not exist in the space in the chamber 102. In addition, since the CDA is supplied to the inside of the chamber 102, the CDA equivalent to the spatial volume size flows in, and the contaminated gas is exhausted, so that the air in the chamber 102 is replaced, and a clean environment is constituted again. The control unit 105 previously calculates a time when the space in the chamber 102 is put into the clean state again in accordance with a ventilation efficiency of air and calculates a time during which the first gate 103 can be opened. This ventilation efficiency may be calculated from the supply and exhaust airflow amount and the space volume in the chamber 102 and may also be obtained from an experiment. After standing by in S36 for the predetermined time, the control unit 105 sets the ventilation flag as 1 (S38). Thereafter, the process returns to S4 for the processing on the next substrate.

In a case where the error is detected in S18, since the supply of the imprint material is not yet performed at this time point, the space in the chamber 102 is not contaminated. In view of the above, in this case, the substrate may be conveyed to the first containment unit 22. Specifically, the control unit 105 opens the first gate 103 (S40) and controls the conveyance robot 120 to convey the substrate S to the first containment unit 22 via the first gate 103 (S42). Thereafter, the control unit 105 closes the first gate 103 (S44). Thereafter, the process returns to S4 for the processing on the next substrate.

In a case where the process returns to S4 for the processing on the next substrate, as described above, it is confirmed in S4 that the previous substrate does not exist in the chamber 102 and confirmed in S6 that the ventilation flag is set as 1. Normally, the ventilation flag is not set as 0 in S6, but since the process may be interrupted while the ventilation flag remains as 0 in some cases because of a supply abnormality of the imprint material, a foreign substance adhesion error of the mold, or the like in a process loop from S20 to S28, the above-described confirmation is performed in S6.

In the above-described processing, until the predetermined time elapses in S36 since the second gate is closed (S34) in the substrate carry-out operation, the opening of the first gate in the next substrate carry-in operation (S10) is prohibited. According to this, the clean state is regularly maintained in the first containment unit 22. In addition, since the subsequent substrate carry-in operation is performed after the space in the chamber 102 is put into the clean state, the contamination of the substrate based on the cross contamination is avoided.

FIG. 5 illustrates a modified example of the imprint apparatus illustrated in FIG. 1. The same components are assigned with the same reference signs in FIG. 1, and descriptions thereof will be omitted. The imprint apparatus 100 in FIG. 5 is provided with a first conveyance unit 501 that conveys the substrate between the first containment unit 22 and the processing unit P and a second conveyance unit 502 that conveys the substrate between the processing unit P and the second containment unit 32. The first conveyance unit 501 and the second conveyance unit 502 may respectively adopt configurations similar to the conveyance unit 101 in FIG. 1.

In FIG. 5, sections between a first conveyance space 500A that accommodates the first conveyance unit 501, a second conveyance space 500B that accommodates the second conveyance unit 502, and a processing space 500C that accommodates the processing unit P are separated from one another by partition walls inside the chamber 102. In the first opening section 102a, the partition wall is formed between the first conveyance space 500A and the processing space 500C, and the first gate 103 is arranged therein. In addition, in the second opening section 102b, the partition wall is formed between the second conveyance space 500B and the processing space 500C, and the second gate 104 is arranged therein. In the initial state of the apparatus, the first gate 103 and the second gate 104 are closed. In addition, the first conveyance space 500A, the second conveyance space 500B, and the processing space 500C are respectively supplied with the CDA, and the clean state is maintained. A first shutter 503 may be arranged in an opening section where the first containment unit 22 and the inside of the chamber 102 are communicated with each other, and a second shutter 504 may be arranged in an opening section where the second containment unit 32 and the inside of the chamber 102 are communicated with each other. It should be noted however that, herein, the first shutter 503 and the second shutter 504 are regularly opened, and instead, opening and closing of the first gate 103 and the second gate 104 are controlled to prevent the cross contamination.

The unprocessed substrate S is carried out by the first conveyance unit 501 from the first containment unit 22 to pass through the first conveyance space 500A and the first gate 103 to be conveyed to the processing unit P of the processing space 500C. The imprint material is supplied to the substrate S by the processing unit P, and the imprint processing is performed. The substrate S where the imprint processing has been performed is carried out by the second conveyance unit 502 from the processing space 500C to pass through the second gate 104 and the second conveyance space 500B to be conveyed to the second containment unit 32.

The control unit 105 conveys the unprocessed substrate S from the first containment unit 22 to the processing unit P of the processing space 500C. Specifically, the control unit 105 opens the first gate 103 and controls the first conveyance unit 501 to carry-in the substrate S into the processing unit P of the processing space 500C and thereafter close the first gate 103 (substrate carry-in operation). Since both the first conveyance space 500A and the processing space 500C are in the clean state, the cross contamination in both the spaces does not occur.

When the substrate S is carried into the processing unit P of the processing space 500C, the imprint material is supplied onto the substrate S by the dispenser 7. At this time, the inside of the processing space 500C is in a state in which the contamination may occur by the mist generated at the time of the supply of the imprint material or the volatilization of the imprint material. However, since the first gate 103 and the second gate 104 are closed, the first conveyance space 500A and the second conveyance space 500B are not to be contaminated. According to this, even when the substrate to be processed later is located in the first containment unit 22 or the first conveyance space 500A, the substrate does not receive the contamination based on the cross contamination and can maintain the clean state.

The substrate S after the imprint processing is ended is exposed to the contaminated space by the processing for supplying the imprint material. For this reason, when the substrate is conveyed to the first conveyance space 500A and the first containment unit 22, the substrate contaminates the first conveyance space 500A and the first containment unit 22, and there is a possibility that the substrate may contaminate the substrate that stands by to be processed later. In view of the above, the control unit 105 opens the second gate 104 and controls the second conveyance unit 502 to carry-out the substrate S to the second containment unit 32 via the second gate 104 and thereafter close the second gate 104 (substrate carry-out operation). At this time, since the substrate S corresponding to the contamination source is carried into the second containment unit 32 and the second conveyance space 500B is connected to the contaminated processing space 500C through the second gate 104, the second conveyance space 500B is contaminated. In this state, when the first gate 103 is opened to process the next substrate, there is a risk that the contaminated gas in the processing space 500C flows into the first conveyance space 500A through the first gate 103. Moreover, since the substrate is also carried into the contaminated processing space 500C, there is a risk that a cause of defect derived from the cross contamination may occur.

To avoid this risk, the control unit 105 prohibits the opening of the first gate 103 until a predetermined time elapses since the substrate on which the pattern has been formed by the processing unit P is contained in the second containment unit 32 and the second gate 104 is closed in the substrate carry-out operation. Since the substrate S is already carried out from the processing space 500C and also the first gate 103 is closed, the contamination source exposed to the processing space 500C does not exist. In addition, since the CDA is supplied into the space, air equivalent to the spatial volume size flows in, and the contaminated air is exhausted, so that the air in the space is replaced, and the clean environment is constituted again. The control unit 105 calculates a time when the processing space 500C becomes clean again in accordance with the ventilation efficiency of the air, for example. The standby time may be determined on the basis of this. This ventilation efficiency can be calculated from the supply and exhaust airflow amount and the space volume and may also be obtained from an experiment.

<Embodiment of Method of Manufacturing an Article>

A method of manufacturing an article according to an embodiment of the present invention is preferable, for example, for manufacturing an article such as a micro device such as a semiconductor device or an element including a fine structure. The method of manufacturing an article according to the present embodiment including a step of performing the pattern formation by using the above-described imprint apparatus on the imprint material on the substrate (step of performing the imprint processing on the substrate) and working on the substrate on which the pattern has been formed in the above-described step (substrate on which the imprint processing has been performed). Furthermore, the above-described manufacturing method includes other related-art processes (oxidation, film formation, vapor deposition, doping, planarization, etching, resist separation, dicing, bonding, packaging, and the like). The method of manufacturing an article according to the present embodiment is advantageous in terms of at least one of performance, quality, productivity, and production costs of the article as compared with the related-art method.

The cured material pattern that has been formed by using the imprint apparatus is used permanently for at least part of various articles or temporarily when various articles are manufactured. The article includes an electric circuit element, an optical element, an MEMS, a recording element, a sensor, a mold, or the like. As the electric circuit element, a volatile or non-volatile semiconductor memory such as a DRAM, an SRAM, a flash memory, and an MRAM, a semiconductor element such as an LSI, a CCD, an image sensor, and an FPGA, and the like are enumerated. As the mold, a mold for imprint and the like are enumerated.

The cured material pattern is used as it is as at least part of constituting members of the above-described article or used temporarily as a resist mask. After etching, ion implantation, or the like is performed in the working step for the substrate, the resist mask is removed.

Figure 6A:
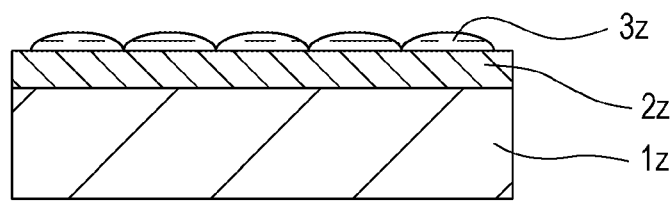
FIG. 6A is an explanatory diagram for describing a method of manufacturing an article.

Next, a specific manufacturing method for an article will be described. As illustrated in FIG. 6A, a substrate $1z$ such as a silicon wafer on which a work material $2z$ such as an insulator is formed on a surface is prepared, and subsequently, an imprint material $3z$ is applied onto the surface of the work material $2z$ by an inkjet method or the like. Herein, a situation is illustrated in which the imprint material $3z$ shaped into a plurality of droplets are applied onto the substrate.

Figure 6B:
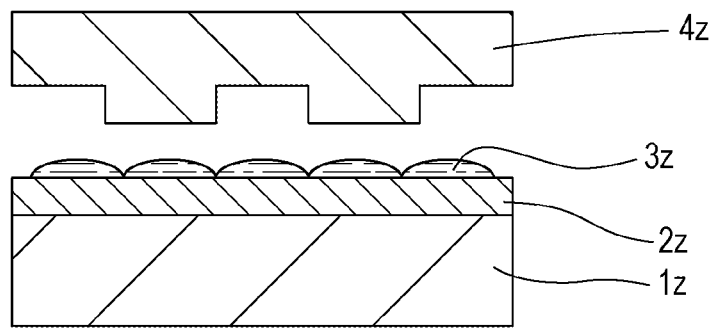
FIG. 6B is an explanatory diagram for describing the method of manufacturing an article.
Figure 6C:
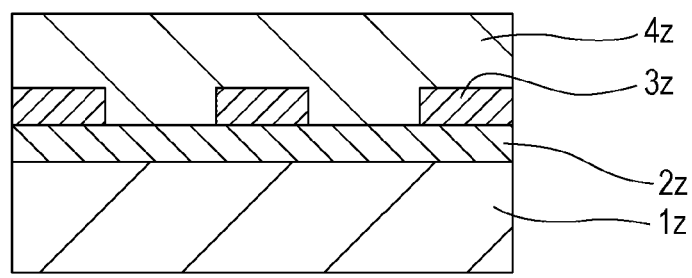
FIG. 6C is an explanatory diagram for describing the method of manufacturing an article.

As illustrated in FIG. 6B, a side where concave and convex patterns are formed of a mold $4z$ for imprint faces to oppose the imprint material $3z$ on the substrate. As illustrated in FIG. 6C, the substrate $1z$ applied with the imprint material $3z$ and the mold $4z$ are brought into contact with each other, and pressure is applied thereto. The imprint material $3z$ is filled in a gap between the mold $4z$ and the work material $2z$. When light is radiated through the mold $4z$ as the curing energy in this state, the imprint material $3z$ is cured.

Figure 6D:
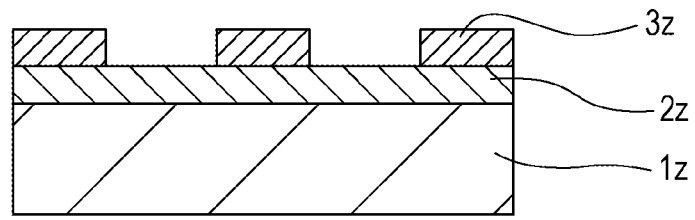
FIG. 6D is an explanatory diagram for describing the method of manufacturing an article.

As illustrated in FIG. 6D, after the imprint material $3z$ is cured, when the mold $4z$ and a substrate $1z$ are separated from each other, the cured material pattern of the imprint material $3z$ is formed on the substrate $1z$. The cured material pattern has a shape in which the concave part of the mold corresponds to the convex part of the cured material and the convex part of the mold corresponds to the concave part of the cured material, that is, the concave and convex patterns of the mold $4z$ are transferred to the imprint material $3z$.

Figure 6E:
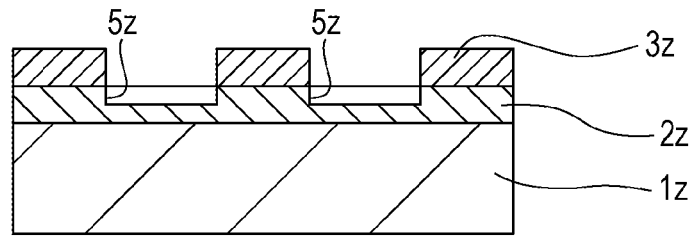
FIG. 6E is an explanatory diagram for describing the method of manufacturing an article.
Figure 6F:
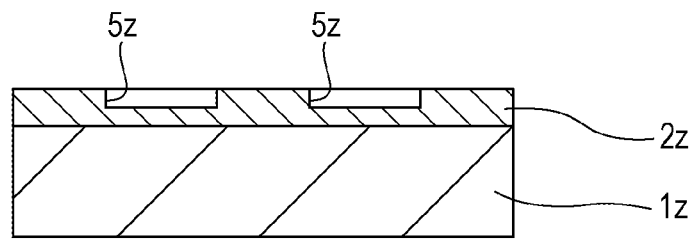
FIG. 6F is an explanatory diagram for describing the method of manufacturing an article.

As illustrated in FIG. 6E, when etching is performed by using the cured material pattern as an etching-proof mask, a part where the cured material does not exist or thinly remains of a surface of the work material $2z$ is removed to form a groove $5z$. It should be noted that the above-described remaining part is also preferably removed by etching of a different type from the above-described etching. As illustrated in FIG. 6F, when the cured material pattern is removed, an article in which the groove $5z$ is formed on the surface of the work material $2z$ is obtained. Herein, the cured material pattern is removed, but the cured material pattern may also be used even after the process without removing the cured material pattern as a film for an interlayer insulator included in a semiconductor element, that is, a component of an article, for example.

According to the present invention, the imprint apparatus that is advantageous to the suppression of the chemical contamination within the apparatus is provided.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. An apparatus characterized by comprising:
    a processing unit that cures a curable material on a substrate while the curable material on the substrate is in contact with a mold;
    a chamber that accommodates the processing unit;
    a first gate which is located between the chamber and first containment unit that contains the substrate before being processed by the processing unit,
    a second gate which is located between the chamber and a second containment unit that contains the substrate after being processed by the processing unit; and
    a control unit configured to control opening and closing of the first gate and opening and closing of the second gate;
    wherein the control unit performs control to open the second gate, store the substrate after being processed by the processing unit in the second containment unit, and then close the second gate, and
    wherein the control unit that performs the control to prohibit opening of the first gate until a predetermined time elapses after the second gate is closed.

2. The apparatus according to claim 1, further comprising:
    a conveyance unit that is accommodated in the chamber and conveys the substrate between each of the first containment unit and the second containment unit and the processing unit,
    the apparatus being characterized in that
    the control unit performs
    a substrate carry-in operation for opening the first gate, conveying the unprocessed substrate by the conveyance unit from the first containment unit to the processing unit via the first gate, and closing the first gate, and
    a substrate carry-out operation for opening the second gate, conveying the substrate being processed by the processing unit by the conveyance unit from the processing unit to the second containment unit via the second gate, and closing the second gate, and
    prohibits opening of the first gate in the next substrate carry-in operation until the predetermined time elapses after the second gate is closed in the substrate carry-out operation.

3. The apparatus according to claim 2, characterized in that the control unit opens the first gate and conveys the substrate by the conveyance unit to the first containment unit via the first gate in a case where an error is detected before the curable material is supplied onto the substrate in the processing unit after the substrate carry-in operation.

4. The apparatus according to claim 1, characterized in that the predetermined time is a time spent from when the second gate is closed until volatile components of the curable material are exhausted to an outside of the chamber.

5. The apparatus according to claim 4, characterized in that the predetermined time is determined on a basis of a ventilation efficiency in the chamber.

6. The apparatus according to claim 2, characterized in that
    the conveyance unit includes a first conveyance unit conveys the substrate between the first containment unit and the processing unit and a second conveyance unit that conveys the substrate between the processing unit and the second containment unit,
    sections between a space including the processing unit, a space including the first conveyance unit, and a space including the second conveyance unit are separated from one another by partition walls inside the chamber,
    the first gate is arranged in an opening section formed in a partition wall of the partition walls between the first conveyance unit and the processing unit, and
    the second gate is arranged in an opening section formed in the partition wall between the second conveyance unit and the processing unit.

7. The apparatus according to claim 1, wherein the chamber, the first containment unit, and the second containment unit are mutually independent spaces.

8. A method of manufacturing an article, the method comprising:
    a step of curing a curable material on the substrate by using an apparatus; and
    a step of processing the substrate on which the curable material is cured in the above-described step
    wherein the apparatus comprising:
    a processing unit that cures a curable material on a substrate while the curable material on the substrate is in contact with a mold;
    a chamber that accommodates the processing unit,
    a first gate which is located between the chamber and a first containment unit that contains the substrate before being processed by the processing unit,
    a second gate which is located between the chamber and a second containment unit that contains the substrate after being processed by the processing unit; and
    a control unit configured to control opening and closing of the first gate and opening and closing of the second gate;
    wherein the control unit performs control to open the second gate, store the substrate after being processed by the processing unit in the second containment unit, and then close the second gate, and
    wherein the control unit that performs control to prohibit opening of the first gate until a predetermined time elapses after the second gate is closed.

* * * * *